(12) United States Patent
Nikaido et al.

(10) Patent No.: US 8,247,270 B2
(45) Date of Patent: Aug. 21, 2012

(54) METHOD OF MANUFACTURING SEMICONDUCTOR COMPONENT, AND SEMICONDUCTOR COMPONENT

(75) Inventors: Hiroki Nikaido, Tokyo (JP); Mitsuo Sugino, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/990,220

(22) PCT Filed: May 13, 2009

(86) PCT No.: PCT/JP2009/002076
§ 371 (c)(1),
(2), (4) Date: Oct. 29, 2010

(87) PCT Pub. No.: WO2009/139153
PCT Pub. Date: Nov. 19, 2009

(65) Prior Publication Data
US 2011/0037174 A1    Feb. 17, 2011

(30) Foreign Application Priority Data

May 16, 2008    (JP) .................................. 2008-129067

(51) Int. Cl.
*H01L 21/44* (2006.01)
(52) U.S. Cl. ................................ 438/113; 257/E21.502
(58) Field of Classification Search .................. 438/113; 257/E21.502
See application file for complete search history.

(56) References Cited

U.S. PATENT DOCUMENTS

| | | | |
|---|---|---|---|
| 6,617,046 B2* | 9/2003 | Noro et al. ..................... 428/620 |
| 6,670,264 B2* | 12/2003 | Sakuyama et al. ............. 438/610 |
| 2004/0115868 A1 | 6/2004 | Ono | |
| 2006/0073344 A1* | 4/2006 | Jayaraman ..................... 428/414 |
| 2007/0037319 A1* | 2/2007 | Chan et al. ..................... 438/108 |
| 2007/0145548 A1* | 6/2007 | Park et al. ...................... 257/678 |
| 2007/0252285 A1* | 11/2007 | Shiozawa et al. ............. 257/777 |
| 2010/0129960 A1* | 5/2010 | Mejima et al. ................ 438/107 |

FOREIGN PATENT DOCUMENTS

| EP | 1030357 | 8/2000 |
|---|---|---|
| JP | 2004-186629 | 7/2004 |
| JP | 2004-193497 | 7/2004 |
| JP | 2005-251880 | 9/2005 |
| WO | WO 99/23696 | 5/1999 |

OTHER PUBLICATIONS

International Search Report for International Application No. PCT/JP2009/002076, Jun. 9, 2009.

\* cited by examiner

*Primary Examiner* — Alexander Ghyka
*Assistant Examiner* — Stanetta Isaac
(74) *Attorney, Agent, or Firm* — Ditthavong Mori & Steiner, P.C.

(57) ABSTRACT

A method of manufacturing a semiconductor component of the present invention has: obtaining a semiconductor wafer having stud electrodes formed on a functional surface thereof, and a circuit board having solder bumps on one surface and having electrode pads on the other surface thereof; bonding the semiconductor wafer and the circuit board, while providing a resin layer having a flux activity between the semiconductor wafer and the circuit board, and so as to bring the stud electrodes into contact with the solder bumps, while penetrating the resin layer having a flux activity, to thereby obtain a bonded structure; applying a solder material onto the electrode pads of the bonded structure; and dicing the bonded structure to obtain a plurality of semiconductor components.

20 Claims, 3 Drawing Sheets (a)

(b)

(c)

(d)

METHOD OF MANUFACTURING SEMICONDUCTOR COMPONENT, AND SEMICONDUCTOR COMPONENT

TECHNICAL FIELD

The present invention relates to a method of manufacturing a semiconductor component, and semiconductor component.

BACKGROUND ART

In association with recent trends of the electronic instruments towards advanced functionalization and expanded applications into mobile tools, there are growing demands on higher densification and higher integration of semiconductor devices, and this has promoted increase in the capacity and densification of IC packages. Known methods of manufacturing this sort of semiconductor devices are such as bonding an adhesive sheet (dicing sheet) to a semiconductor wafer composed of silicon, gallium, arsenic and so forth, dicing the wafer to separate individual semiconductor elements (segmentation), expanding the sheet, picking up the segmented semiconductor elements, and transferring the semiconductor elements to assembly process of semiconductor device in which the semiconductor elements are mounted by die-bonding onto metal lead frames, tape-like substrates, organic hard substrates and so forth.

In this sort or processes, it has been necessary to mounting the semiconductor elements one-by-one onto the substrates or the like. In particular in view of adapting the semiconductor elements to area mounting system such as flip-chip bonding, it has been necessary to independently form solder balls thereonto, enough to complicate the processes.

DISCLOSURE OF THE INVENTION

It is therefore an object of the present invention to provide a method of manufacturing a semiconductor component capable of improving productivity of the semiconductor component.

The object described in the above may be accomplished by the present invention described in (1) to (17) below.

(1) A method of manufacturing a semiconductor component which includes:

obtaining a semiconductor wafer having stud electrodes formed on a functional surface thereof, and a circuit board having solder bumps on one surface and having electrode pads on the other surface thereof;

bonding the semiconductor wafer and the circuit board, while providing a resin layer having a flux activity between the semiconductor wafer and the circuit board, and so as to bring the stud electrodes into contact with the solder bumps, while penetrating the resin layer having a flux activity, to thereby obtain a bonded structure;

applying a solder material onto the electrode pads of the bonded structure; and dicing the bonded structure to obtain a plurality of semiconductor components.

(2) The method of manufacturing a semiconductor component as described in (1), wherein the circuit board has openings formed therein, so as to allow therethrough effluence of the resin layer having a flux activity in the step of bonding of the semiconductor wafer with the circuit board.

(3) The method of manufacturing a semiconductor component as described in (1) or (2), wherein the resin layer having a flux activity is a film, and in the step of bonding, the semiconductor wafer and the circuit board are bonded, while keeping the film bonded to the functional surface of the semiconductor wafer.

(4) The method of manufacturing a semiconductor component as described in (1) or (2), wherein the resin layer having a flux activity is a film; and
in the step of bonding, the semiconductor wafer and the circuit board are bonded, while keeping the film bonded to the surface of the circuit board having the solder bumps formed thereon.

(5) The method of manufacturing a semiconductor component as described in (1) or (2), wherein the circuit board is a flexible circuit board.

(6) The method of manufacturing a semiconductor component as described in (1) or (2), wherein the circuit board is a rigid circuit board.

(7) The method of manufacturing a semiconductor component as described in (5), wherein the flexible circuit board has a coefficient of thermal expansion in the in-plane direction of 10 [ppm/K] or smaller.

(8) The method of manufacturing a semiconductor component as described in (5), wherein the flexible circuit board has a coefficient of thermal expansion in the in-plane direction of 4 [ppm/K] or larger.

(9) The method of manufacturing a semiconductor component as described in (6), wherein the rigid circuit board has a coefficient of thermal expansion in the in-plane direction of 15 [ppm/K] or smaller.

(10) The method of manufacturing a semiconductor component as described in (6), wherein the rigid circuit board has a coefficient of thermal expansion in the in-plane direction of 5 [ppm/K] or larger.

(11) The method of manufacturing a semiconductor component as described in (1) or (2), wherein the circuit board is configured by a plurality of circuit boards bonded to a support.

(12) The method of manufacturing a semiconductor component as described in (1) or (2), wherein the resin layer having a flux activity is configured by a resin composition which contains a crosslinkable resin and a compound having a flux activity.

(13) The method of manufacturing a semiconductor component as described in (12), wherein the compound having a flux activity serves as a curing agent of the crosslinkable resin.

(14) The method of manufacturing a semiconductor component as described in (12), wherein the compound having a flux activity has at least one carboxyl group or phenolic hydroxyl group in the molecule.

(15) The method of manufacturing a semiconductor component as described in (12), wherein the compound having a flux activity is represented by the formula (1) below:

[Chemical Formula 1]

$$HOOC-(CH_2)_n-COOH \qquad (1)$$

(n is an integer which satisfies $0 \leq n \leq 20$.)

(16) The method of manufacturing a semiconductor component as described in (1) or (2), wherein the electrode pads applied with the solder material are further applied with a resin layer having a flux activity.

(17) A semiconductor component obtained by the method of manufacturing a semiconductor component described in (1) or (2).

According to the present invention, a method of manufacturing a semiconductor component capable of improving productivity of the semiconductor component may be provided.

BRIEF DESCRIPTION OF THE DRAWINGS

The above and other objects, features and advantages of the present invention will be more apparent from the following description of certain preferred embodiments taken in conjunction with the accompanying drawings.

BEST MODES FOR CARRYING OUT THE INVENTION

A method of manufacturing a semiconductor component, and a semiconductor component of the present invention will be explained.

The method of manufacturing a semiconductor component of the present invention characteristically includes a step of obtaining a semiconductor wafer having stud electrodes formed on a functional surface thereof, and a circuit board having solder bumps on one surface and having electrode pads on the other surface thereof; a step of bonding the semiconductor wafer and the circuit board, while providing a resin layer having a flux activity between the semiconductor wafer and the circuit board, and so as to bring the stud electrodes into contact with the solder bumps, while penetrating the resin layer having a flux activity, to thereby obtain a bonded structure; a step of applying a solder material onto the electrode pads of the bonded structure; and a step of dicing the bonded structure to obtain a plurality of semiconductor components.

As may be understood from the above, by integrally stacking the semiconductor wafer before being diced with the circuit board, and by dicing the stacked structure, a plurality of semiconductor components may be produced in an efficient manner.

Preferred embodiments of the method of manufacturing a semiconductor component of the present invention will be detailed, referring to the attached drawings.

Figure 1:
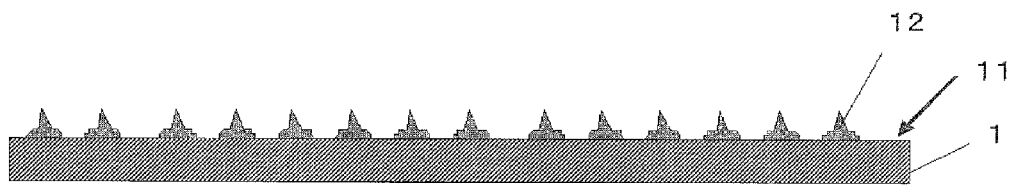
FIG. 1 is a sectional view schematically illustrating an exemplary semiconductor wafer used in the present invention.

FIG. 1 is a sectional view illustrating a state where stud electrodes are formed on a functional surface of a semiconductor wafer.

As illustrated in FIG. 1, a semiconductor wafer 1 having a plurality of stud electrodes 12 formed on a functional surface 11 side thereof is obtained.

The stud electrodes 12 may be exemplified by gold bumps; copper bumps or copper posts obtained by plating bumps with nickel and gold, and then further by solder; and solder bumps. Among them, the gold bumps capable of being sharpened at the tip are preferable. As a consequence, bondability may be improved.

While pitch of the stud electrodes 12 (center-to-center distance) most popularly adopted at present is 50 to 300 μm or around, the distance is not limited thereto, allowing adoption of still narrower pitch (note that, in the paragraphs below, all numerical ranges expressed using "to" are defined to include numerals placed before and after "to", as the lower and upper limit values).

Figure 2:
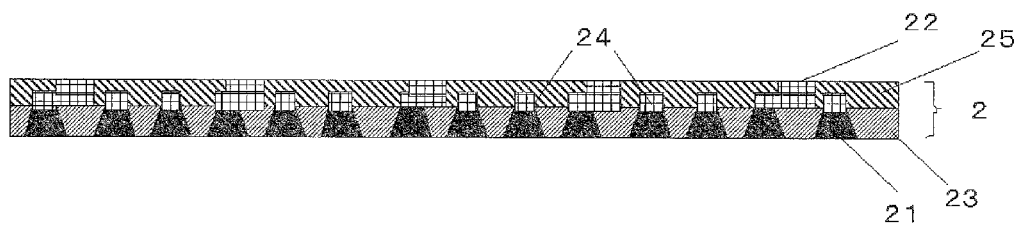
FIG. 2 is a sectional view schematically illustrating an exemplary circuit board used in the present invention.

On the other hand, as illustrated in FIG. 2, a circuit board 2 having solder bumps 21 on one surface side, and electrode pads 22 on the other surface side, is obtained.

The circuit board 2 is not specifically limited, to which both of rigid circuit board and flexible circuit board may be adoptable. The flexible circuit board is preferably used from the viewpoint of formation of vias at a narrow pitch, and economical efficiency.

In one exemplary case of the circuit board 2, solder bumps 21 are formed in vias on a support base 23 as illustrated in FIG. 2. On the support base 23, interconnect patterns 24 are formed. One surface of the support base 23 is covered with a solder resist 25.

Although the pitch of the electrode pads 22 are popularly set to 0.3 to 0.8 mm at present, for the convenience of making use of them as terminals for input/output to or from a mother board, module board and so forth, but still narrower pitch may be adoptable without being limited to the above-described range.

The electrode pads 22 may more preferably be applied with nickel/gold plating, rather than being in the state of bare copper, in view of suppressing diffusion of metals or generation of metal compounds.

Figure 7:
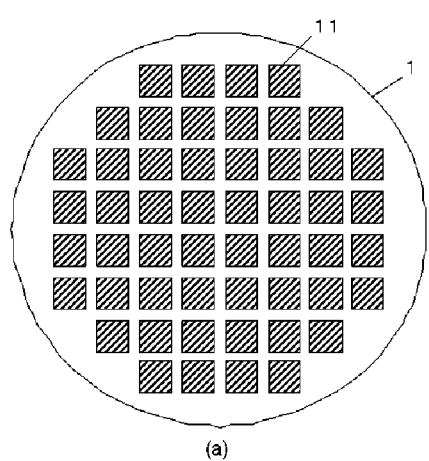
FIGS. 7(a) to 7(d) are top views schematically illustrating an exemplary circuit board used in the present invention.
Figure 7:
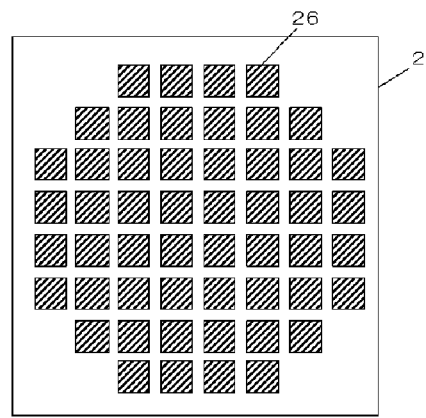
Figure 7:
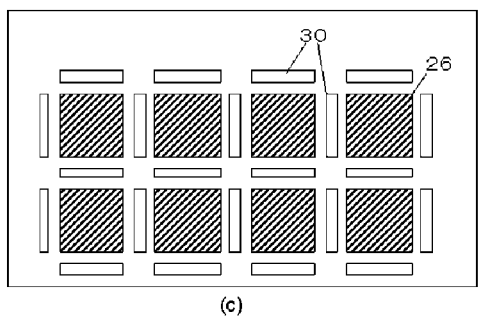
Figure 7:
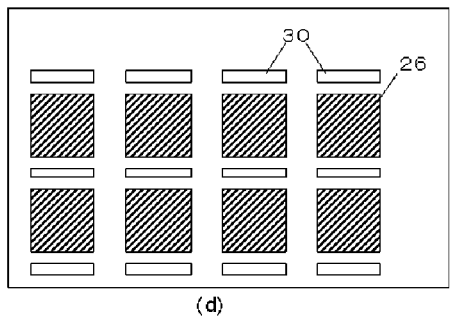

Now as an exemplary case of the circuit board 2, the circuit board 2 having openings 30 formed therein will be explained referring to FIG. 7.

FIG. 7(a) illustrates a layout of the functional surface 11 of the semiconductor wafer 1. FIG. 7(b) illustrates a layout of bonding portions 26 (functional surface) of the circuit board 2. The layout of the functional surface 11 and the layout of the bonding portions 26 have the same pattern of arrangement. The pattern of arrangement may be an array, although not specifically limited. The functional surface 11 has a plurality of stud electrodes (not illustrated) formed thereon. On the other hand, each bonding portion 26 has a plurality of solder bumps (not illustrated) formed on one surface thereof, and a plurality of electrode pads (not illustrated) formed on the other surface thereof.

The openings 30 are now formed so as to surround each bonding portions 26 of the circuit board 2, as illustrated in FIGS. 7(c), (d). In an example illustrated in FIG. 7(c), the openings 30 are formed along four edges of each bonding portion 26. In other words, four openings 30 are formed nearly in parallel with each of the vertical and lateral pairs of the edges of each bonding portion 26. In an example illustrated in FIG. 7(d), two openings 30 are formed nearly in parallel with the vertical pair of the edges of each bonding portion 26. Each opening 30 extends through the circuit board 2 from the top surface to the back surface.

As illustrated in the above, the circuit board 2 preferably has the openings 30 so as to allow therethrough effluence of the resin layer 13 having a flux activity in the process of bonding of the semiconductor wafer 1 with the circuit board 2 (FIGS. 7(c), (d)). By virtue of this configuration, an excessive portion of the resin layer 13 having a flux activity may be guided so as to cause effluence at the openings 30, in the process of thermo-compression bonding of the semiconductor wafer 1 and the circuit board 2. In this way, the stud electrodes 12 and the solder bumps 21 may be prevented from being misaligned, and a desirable level of bondability may integrally be obtained (semiconductor components suppressed typically from contamination may be obtained).

Each opening 30 is preferably formed on the dicing line. In other words, the plurality of openings 30 aligned in parallel with the upper edges of the bonding portions 26 are formed in parallel with the direction of the upper edges of the bonding portions 26. Accordingly, the openings 30 may be removed in the process of dicing. In other words, the resin layer 13 having a flux activity, which flew out from the openings 30 may be removed without wiping. As a consequence, the number of processes as a whole may be reduced, and thereby the productivity of the semiconductor components may be improved.

Alternatively, a plurality of openings 30 may consecutively be formed along a single edge of each bonding portion 26. As illustrated in FIG. 7(c), it may be preferable to form four openings 30 per one bonding portion 26. A larger number of openings 30 per one bonding portion 26 may be more advantageous in terms of efficiently allowing the resin layer 13 having a flux activity to cause effluence therethrough. In this way, the stud electrodes 12 and the solder bumps 21 may more exactly be prevented from being misaligned.

Geometry of the openings 30 is not specifically limited. For example, as illustrated in FIGS. 7(c), (d), the geometry of each opening 30 when viewed in the direction normal to the substrate may be a rectangle. Alternatively, a circular geometry capable of ensuring uniform strength may be preferable, where the area of opening may be good enough so far as it allows the resin to smoothly flow thereinto.

Length of the opening 30 as viewed in the direction of dicing may be same with, or smaller than, the length of the edge of the bonding portion 26. On the other hand, the width of the opening 30 as viewed in the direction normal to the direction of dicing may be adjusted almost equivalent to the width of dicing, although not specifically limited. By virtue of the adjustment, effluent of the resin layer 13 having a flux activity may be removed in the process of dicing. Accordingly, the productivity of the semiconductor components may be improved.

For the case where the flexible circuit board is adopted, coefficient of thermal expansion in the in-plane direction thereof is not specifically limited, where it may be adjusted preferably to 10 [ppm/K] or smaller, and particularly preferably to 4 to 8 [ppm/K]. The coefficient of thermal expansion adjusted to the above-described range may ensure an excellent level of integral bondability.

For the case where the rigid circuit board is adopted, coefficient of thermal expansion in the in-plane direction thereof is not specifically limited, where it may be adjusted preferably to 15 [ppm/K] or smaller, and particularly preferably to 5 to 12 [ppm/K]. The coefficient of thermal expansion adjusted to the above-described range may ensure an excellent level of integral bondability.

Figure 6:
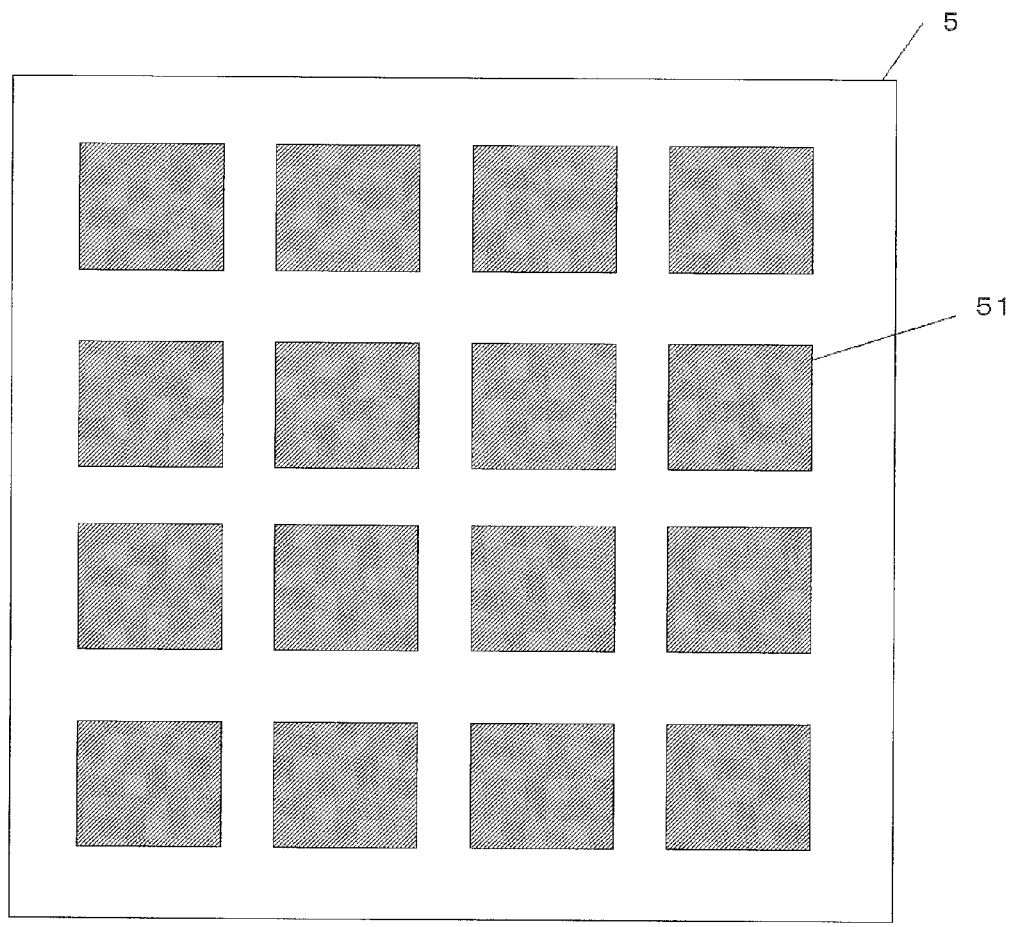
FIG. 6 is a sectional view schematically illustrating an exemplary circuit board used in the present invention.

Alternatively, as illustrated in FIG. 6, the circuit board 2 may be a structure obtained by bonding a plurality of (or a single) circuit boards 51 onto a support 5. In this way, the circuit board 2 and the semiconductor wafer 1 may be bonded at a predetermined position, and thereby a plurality of semiconductor components may be obtained later by dicing or the like.

Figure 3:
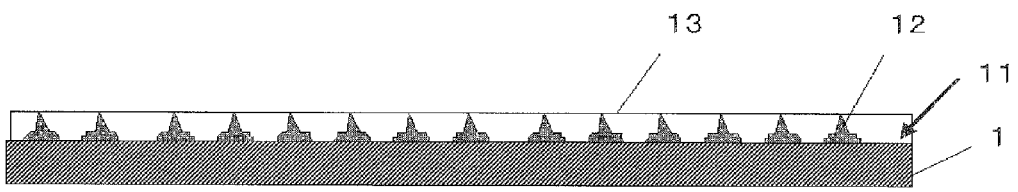
FIG. 3 is a sectional view schematically illustrating an exemplary semiconductor wafer with a resin layer having a flux activity formed thereon, used in the present invention.

Next, the resin layer 13 having a flux activity is formed by coating, laminating or the like, so as to cover the plurality of stud electrodes 12 on the semiconductor wafer 1 (FIG. 3). In this way, the stud electrodes 12 and the solder bumps 21 may now be bondable with solder, without applying a flux.

While the resin layer 13 having a flux activity in a film form was disposed on the semiconductor wafer 1 in this embodiment, the resin layer 13 having a flux activity in a film form may alternatively be disposed on the circuit board 2 (on the surface of the circuit board 2 having the solder bumps 21 formed thereon), without being limited to the above-described configuration. In short, it may be good enough that the resin layer 13 having a flux activity in a film form is disposed, in a bonded manner, on the surface of either the semiconductor wafer 1 or the circuit board 2.

Methods of obtaining this sort of resin layer 13 having a flux activity may be exemplified by a method of coating and drying a pasty resin composition, and a method of laminating a filmy resin composition.

The resin composition composing the resin layer 13 having a flux activity typically contains a crosslinkable resin, and a compound having a flux activity.

The crosslinkable resin adoptable to the present invention may be exemplified not only by those classified into so-called thermosetting resins such as an epoxy resin, an oxetane resin, a phenol resin, a (meth)acrylate resin, an unsaturated polyester resin, a diallyl phthalate resin, and a maleimide resin; but also by thermoplastic resins having functional groups such as a carboxyl group and an epoxy group. Among them, the epoxy resin may preferably be adoptable, by virtue of its excellent curability, persistence, heat resistance of the cured product, moisture resistance and chemical resistance.

As the epoxy resin, both of those which exist in a solid form and in a liquid form at room temperature may be adoptable. Alternatively, the epoxy resin which exists in a solid form at room temperature and the epoxy resin which exists in a liquid form at room temperature may be used in combination. In this way, the degree of freedom in designing melt behavior of the resin layer 13 may further be improved.

The epoxy resin which exists in a solid form at room temperature is not specifically limited, and may be exemplified by bisphenol-type epoxy resins such as a bisphenol A-type epoxy resin and a bisphenol S-type epoxy resin; novolac-type epoxy resins such as a phenol novolac-type epoxy resin and a cresol novolac-type epoxy resin; glycidyl amine-type epoxy resins; glycidyl ester-type epoxy resins; and multi-functional epoxy resins such as a trifunctional epoxy resin and a tetrafunctional epoxy resin. More specifically, the epoxy resin which exists in a solid form at room temperature preferably contains the trifunctional epoxy resin and the cresol novolac-type epoxy resin which exist in a solid form at room temperature. In this way, the moisture resistance of the resultant semiconductor component may be improved.

The epoxy resin which exists in a liquid form at room temperature is not specifically limited, and may be exemplified by a bisphenol A-type epoxy resin, a bisphenol F-type epoxy resin, epoxy resins having a hydrogen-added bisphenol A nucleus, a 4-t-butylcatechol-type epoxy resin, and a naphthalenetype epoxy resin.

Content of the crosslinkable resin is preferably 25 wt % or more and 75 wt % or less of the entire resin composition, and particularly preferably 45 wt % or more and 70 wt % or less. By adjusting the content to the above-described range, a desirable curability may be obtained, and a desirable melt behavior may be designable.

The compound having a flux activity is not specifically limited, so far as it has an effect of removing metal oxide film under heating. For example, the compound may be those exhibiting a flux activity alone by themselves, or promoting a flux activity, and may be exemplified by an activated rosin, a organic acid represented by organic compounds having carboxyl group(s), an amine, a phenol, an alcohol, and an azine.

The compound having a flux activity may more specifically be exemplified by compounds having, in the molecule thereof, at least one carboxyl group and/or phenolic hydroxyl group, which may exist in a liquid form or solid form. The compound having a flux activity may be exemplified by a divalent carboxylic acid.

The compound containing carboxyl group(s) may be exemplified by aliphatic acid anhydrides, alicyclic acid anhydrides, aromatic acid anhydrides, aliphatic carboxylic acids, and aromatic carboxylic acids. The flux compound having phenolic hydroxyl group(s) may be exemplified by phenols.

The aliphatic acid anhydride may be exemplified by succinic anhydride, polyadipic anhydride, polyazelaic anhydride, and polysebacic anhydride or the like.

The alicyclic acid anhydrides may be exemplified by methyl tetrahydrophthalic anhydride, methyl hexahydrophthalic anhydride, methylhymic anhydride, hexahydrophthalic anhydride, tetrahydrophthalic anhydride, trialkyl tetrahydrophthalic anhydride, and methylcyclohexene dicarboxylic anhydride or the like.

The aromatic acid anhydrides may be exemplified by phthalic anhydride, trimellitic anhydride, pyromellitic anhydride, benzophenone tetracarboxylic acid anhydride, ethylene glycol bis(trimellitate), and glycerol tris(trimellitate) or the like.

The aliphatic carboxylic acid may be exemplified by the compound typically represented by the formula (1) below:

[Chemical Formula 1]

$$HOOC-(CH_2)_n-COOH \qquad (1)$$

(n is an integer which satisfies $0 \leq n \leq 20$.)

In the compound represented by the formula (1), n is preferably 3 or larger and 10 or smaller, and particularly preferably 4 or larger and 8 or smaller, in view of flux activity, out gas in the process of bonding, and a balance between elastic modulus and glass transition temperature of the adhesive layer 2 after curing. By adjusting n to the above-described lower limit value or larger, the elastic modulus after curing may be suppressed from increasing, and thereby the adhesiveness with a structure to be adhered may be improved. On the other hand, by adjusting n to the above-described upper limit value or smaller, the elastic modulus of the resin layer 13 may be prevented from degrading, and thereby reliability of connection of the semiconductor component may further be improved.

The compound represented by the formula (1) in the above may be exemplified by glutaric acid ($HOOC-(CH_2)_3-COOH$) with n=3, adipic acid ($HOOC-(CH_2)_4-COOH$) with n=4, pimeric acid ($HOOC-(CH_2)_5-COOH$) with n=5, sebacic acid ($HOOC-(CH_2)_8-COOH$) with n=8 and $HOOC-(CH_2)_{10}-COOH$ with n=10.

Other aliphatic carboxylic acids may be exemplified by formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, and succinic acid.

The aromatic carboxylic acids may be exemplified by benzoic acid, phthalic acid, isophthalic acid, terephthalic acid, hemimellitic acid, trimellitic acid, trimesic acid, mellophanic acid, prehnitic acid, pyromellitic acid, mellitic acid, tolyic acid, xylic acid, hemellitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid; phenolphthalein; and diphenolic acid or the like.

The compounds having phenolic hydroxyl group(s) may be exemplified by monomers containing phenolic hydroxyl group(s) such as phenol, o-cresol, 2,6-xylenol, p-cresol, m-cresol, o-ethyl phenol, 2,4-xylenol, 2,5-xylenol, m-ethyl phenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol and tetrakis phenol; a phenol novolac resin, an o-cresol novolac resin, a bisphenol F novolac resin, a bisphenol A and a novolac resin or the like.

The compound having a flux activity of this sort is preferably a curing agent having a flux activity, capable of being incorporated in a three-dimensional manner by way of reaction with a crosslinkable resin such as epoxy resin. In this way, washing after activation of flux may be omissible, and the reliability may further be improved.

The curing agent having a flux activity may be exemplified by compounds having, in a single molecule thereof, at least two phenolic hydroxyl groups capable of causing addition to a crosslinkable resin such as epoxy resin, and at least one carboxyl group directly bonded to an aromatic group and exhibiting a flux activity to a metal oxide film. Specific examples include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxybenzoic acid); naphthoic acid derivatives such as 1,4-dihydroxy-2-naphthoic acid, 3,5-dihydroxy-2-naphthoic acid, and 3,7-dihydroxy-2-naphthoic acid; phenolphthalein; and diphenolic acid or the like.

These compounds having a flux activity may be used in an independent manner, or in a combined form of two or more species of them.

While content of the compound having a flux activity is not specifically limited, it may be adjusted preferably to 1 wt % or more and 30 wt % or less of the entire resin composition, and particularly preferably to 5 wt % or more and 25 wt % or less. The content lower than the above-described lower limit may result in an insufficient flux activity, whereas the content exceeding the above-described upper limit may leave a portion of the compound having a flux activity unreacted with the crosslinkable resin, and may cause migration. By adjusting the content in the above-described range, strong and desirable bonding may be obtained as a result of reduction of the oxide film on the surface of copper foil.

The resin composition may also contain a curing agent, without special limitation.

The curing agent may be exemplified by phenols, amines and thiols. For the case where epoxy resin is used as the crosslinkable resin, phenols may preferably be used in view of their desirable reactivity with the epoxy resin, small dimensional changes during curing, and appropriate post-curing physical properties (for example, heat resistance, moisture resistance, or the like).

While the phenols are not specifically limited, bifunctional phenols having higher degree of functionality may be preferable, in view of post-curing physical properties of the adhesive layer 2. The phenols may be exemplified by bisphenol A, tetramethyl bisphenol A, diallyl bisphenol A, biphenol, bisphenol F, diallyl bisphenol F, trisphenol, tetrakis phenol, phenol novolacs, and cresol novolacs, where phenol novolacs and cresol novolacs may preferably be used, taking melt viscosity, reactivity with epoxy resin and post-curing physical properties into consideration.

While content of the phenol novolacs used as the curing agent is not specifically limited, it is adjusted preferably to 5 wt % or more, and particularly preferably to 10 wt % or more, of the entire resin composition, in view of allowing the crosslinkable resin to thoroughly cure. A portion of the phenol novolacs remaining unreacted with epoxy resin may be causative of migration. In view of preventing the phenol novolacs from remaining as the residue, it may therefore be preferable to adjust the content to 30 wt % or less, and particularly preferably 25 wt % or less, of the entire resin composition.

For the case where the epoxy resin is used as the crosslinkable resin, the content of the phenol novolac resin may be determined based on an equivalent weight relative to the epoxy resin. More specifically, the equivalent weight of the phenol novolacs relative to the epoxy resin is adjusted preferably to 0.5 or more and 1.2 or less, particularly preferably to 0.6 or more and 1.1 or less, and most preferably 0.7 or more and 0.98 or less. By adjusting the equivalent weight of the phenol novolacs relative to the epoxy resin to the above-described lower limit value or more, the post-curing heat resistance and moisture resistance may be ensured, meanwhile by adjusting the equivalent weight to the upper limit value or smaller, the amount of the phenol novolac resin which possibly remains unreacted with the epoxy resin after curing may be reduced, and thereby the migration resistance may be improved.

Other curing agent may be exemplified by imidazole compounds, and phosphorus compounds.

The imidazole compound may be exemplified by imidazole, 2-methyl imidazole, 2-undecyl imidazole, 2-heptadecyl imidazole, 1,2-dimethyl imidazole, 2-ethyl-4-methyl imidazole, 2-phenyl imidazole, 2-phenyl-phenyl-4-methyl imidazole, 1-benzyl-2-phenyl imidazole, 1-benzyl-2-methyl imidazole, 1-cyanoethyl-2-methyl imidazole, 1-cyanoethyl-2-ethyl-4-methyl imidazole, 1-cyanoethyl-2-undecyl imidazole, 1-cyanoethyl-2-phenyl imidazole, 1-cyanoethyl-2-undecyl imidazolium trimellitate, 1-cyanoethyl-2-phenyl imidazolium trimellitate, 2,4-diamino-6-[2'-methyl)imidazolyl-(1')]-ethyl-s-triazine, 2,4-diamino-6-[2'-undecyl imidazolyl-(1')]-ethyl-s-triazine, 2,4-diamino-6-[2'-ethyl-4-methyl imidazolyl-(1')]-ethyl-s-triazine, 2,4-diamino-6-[2'-methyl imidazolyl-(1')]-ethyl-s-triazine isocyanurate adduct, 2-phenyl imidazole isocyanurate adduct, 2-methyl imidazole isocyanurate adduct, 2-phenyl-phenyl-4,5-dihydroxy dimethyl imidazole, and 2-phenyl-4-methyl-5-hydroxymethyl imidazole.

Among the imidazole compounds, those having melting point of 150° C. or higher may preferably be adoptable. In this way, the curing of the resin layer 13 and the flux function may more readily be satisfied at the same time. More specifically, adoption of the imidazole compounds as described in the above may successfully avoid the cases which are otherwise anticipated under too low melting point, such that the resin layer 13 cures before the oxide film on the solder bumps 21 is removed, and the solder bumps 21 and the stud electrodes 12 are bonded, to thereby destabilize the bonding or degrade persistence of the resin layer 13.

The imidazole compounds having melting point of 150° C. or higher may be exemplified by 2-phenylhydroxyimidazole, 2-phenyl-4-methyl hydroxyimidazole, and 2-phenyl-4-methyl imidazole. The upper limit value of the melting point of the imidazole compounds is not specifically limited, and may appropriately be set depending, for example, on bonding temperature of the resin layer 13.

While content of the imidazole compounds used as the curing agent is not specifically limited, it is adjusted preferably to 0.005 wt % or more and 10 wt % or less of the entire resin composition, and particularly preferably 0.01 wt % or more and 5 wt % or less. By adjusting the content of the imidazole compounds to the above-described lower limit value of more, the imidazole compounds may be allowed to more effectively function as a curing catalyst for the crosslinkable resin, to thereby improve the curability of the resin layer 13. On the other hand, by adjusting the content of the imidazole compounds to the above-described upper limit value or less, the resin may have a melt viscosity not excessively high at a melt temperature of the solder, and thereby a desirable structure of solder bonding may be obtained. In addition, the persistence of the resin layer 13 may further be improved.

The phosphorus-containing compound may be exemplified by triphenyl phosphine; molecular compounds of tetra-substituted phosphonium and multi-functional phenol compound; and molecular compounds of tetra-substituted phosphonium and proton donor and trialkoxy silane compound. Among them, the molecular compounds of tetra-substituted phosphonium and multi-functional phenol compound, and the molecular compounds of tetra-substituted phosphonium and proton donor and trialkoxy silane compound, which are more excellent in fast curability of the resin layer 13, less corrosive property with respect to aluminum pads of the semiconductor element, and persistence of the resin layer 13, are particularly preferable.

The resin composition may contain a film-forming resin different from the above-described crosslinkable resin, although not specifically limited.

The film-forming resin adoptable herein include a phenoxy resin, a polyester resin, a polyurethane resin, a polyimide resin, a siloxane-modified polyimide resin, a polybutadiene, a polypropylene, a styrene-butadiene-styrene copolymer, a styrene-ethylene-butyrene-styrene copolymer, a polyacetal resin, a polyvinyl butyral resin, a polyvinyl acetal resin, a butyl rubber, a chloroprene rubber, a polyamide resin, an acrylonitrile-butadiene copolymer, an acrylonitrile-butadiene-acrylic acid copolymer, an acrylonitrile-butadiene-styrene copolymer, a polyvinyl acetate, a nylon, and an acryl rubber. These resins may be used in an independent manner, or in a combined form of two or more species of them.

The phenoxy resin used as the film-forming resin preferably has a number-average molecular weight of 5000 to 15000. By using the phenoxy resin of this range, fluidity of the resin layer 13 before being cured may be suppressed, and thereby the thickness of the resultant layer may be made uniform. The phenoxy resin may be exemplified by those having skeletons of a bisphenol A-type, a bisphenol F-type, and a biphenyl-type, without limitation. The phenoxy resin having a saturation water content of 1% or smaller is preferable, in view of suppressing foaming or separation under high temperatures typically in the process of bonding and soldering.

Alternatively, resins containing a nitrile group, an epoxy group, a hydroxyl group, and a carboxyl group may be adoptable as the film-forming resin, for the purpose of improving adhesiveness, or compatibility with other resins. For example, an acryl rubber may be adoptable as this sort of resin.

Adoption of the acryl rubber as the film-forming resin may improve stability of formation of the film in the process of forming the resin layer 13 in a film form. The adoption also contributes to lower the elastic modulus of the resin layer 13 and thereby to reduce residual stress between the structure to be adhered and the resin layer 13, and thereby the adhesiveness to the structure to be adhered may be improved.

The acryl rubber is preferably a (meth)acrylate ester copolymer which contains a monomer unit having an epoxy group, a hydroxyl group, a carboxyl group, or a nitrile group. By the selection, adhesiveness to the structure to be adhered, such as the back surface of the semiconductor element or a coated material on the semiconductor element, may be improved. The monomer adoptable to this sort of the (meth) acrylate ester copolymer may be exemplified by a glycidyl (meth)acrylate having a glycidyl group, a (meth)acrylate having a hydroxyl group, a (meth)acrylate having a carboxyl group, and a (meth)acrylonitrile having a nitrile group.

Among them, the (meth)acrylate ester copolymer which contains a monomer unit having a glycidyl group or a carboxyl group may particularly preferably be adoptable. By the adoption, curing of the adhesive film may further be accelerated, and thereby adhesiveness to the structure to be adhered may be improved.

When the (meth)acrylate ester copolymer which contains a monomer having a carboxyl group is used, content of the monomer unit having a carboxyl group in the copolymer may be adjusted typically to 0.5 wt % or more of the entire (meth) acrylate ester copolymer, in view of improving the adhesiveness to the structure to be adhered, and preferably to 1 wt % or more. From the viewpoint of further improving the persistence of the resin layer 13, the content of the monomer unit having a carboxyl group may be adjusted typically to 10 wt % or less of the entire (meth)acrylate ester copolymer, and preferably 5 wt % or less.

Weight-average molecular weight of the (meth)acrylate ester copolymer is typically 1,000 or larger and 1,000,000 or smaller, and preferably 3,000 or larger and 900,000 or smaller. By the adjustment in the above-described range, the film-forming property of the resin layer 13 may further be improved, and the fluidity in the process of bonding may be ensured.

The weight-average molecular weight of the (meth)acrylate ester copolymer may be measured by gel permeation chromatography (GPC). Measurement may be made typically using a high-performance GPC apparatus Model SC-8020 from TOSOH Corporation with a column packed with TSKgel $GMH_{XL}$-L, at a temperature of 40° C., using a tetrahydrofuran as a solvent.

The glass transition temperature of the (meth)acrylate ester copolymer is adjusted typically to 0° C. or higher, and preferably 5° C. or higher, in view of suppressing the adhesive film from becoming excessively tacky, to thereby further improve the workability. From the viewpoint of further improving the adhesiveness at low temperatures, the glass transition temperature of the (meth)acrylate ester copolymer is preferably adjusted typically to 30° C. or lower, and preferably 20° C. or lower.

The glass transition temperature of the (meth)acrylate ester copolymer may be measured, for example, by pulling the film using a thermo-mechanical analyzer (TMA/SS6100 from Seiko Instruments Inc.) under a constant load (10 mN), while elevating the temperature from −65° C. at a rate of temperature elevation of 5° C./min., and may be determined based on an inflection point.

While the content of the film-forming resin is not specifically limited, it may preferably be adjusted to 5 wt % or more and 50 wt % or less of the entire resin composition. By adding the film-forming resin within the above-described range, the film-forming property may be suppressed from degrading, and the resin layer 13 may be suppressed from increasing in the elastic modulus after being cured, thereby the adhesiveness with the structure to be adhered may further be improved. In addition, by the addition within the above-described range, the resin layer 13 may be suppressed from increasing in the melt viscosity.

For the case where particularly advanced levels of characteristics such as heat resistance, dimensional stability and moisture resistance are required, it may be further preferable for the resin composition to contain an inorganic filler. The inorganic filler may be exemplified by silicates such as talc, calcined clay, uncalcined clay, mica and glass; oxides such as titanium oxide, alumina, and powders of fused silica (fused spherical silica, fused crushed silica) and crystalline silica; carbonates such as calcium carbonate, magnesium carbonate and hydrotalcite; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; and nitrides such as aluminum nitride, boron nitride and silicon nitride. These inorganic fillers may be used in an independent manner, or in a combined form of two or more species of them. Among them, silica powders such as fused silica and crystalline silica are preferable, and spherical fused silica is particularly preferable.

By adding the inorganic filler to the resin composition, the resin composition after being cured may be improved in the heat resistance, moisture resistance, strength, and separability of the resin layer 13. While geometry of the inorganic filler is not specifically limited, sphere may be preferable in view of providing a resin composition for composing the resin layer 13 which exhibits no special anisotropy.

While average grain size of the inorganic filler is not specifically limited, it may be adjusted preferably to 0.5 μm or smaller, particularly preferably from 0.01 to 0.45 μm, and most preferably from 0.01 to 0.3 μm. Too small average grain size may degrade the strength as a result of increased tendency of flocculation of the inorganic filler, whereas too large size may degrade transparency of the resin layer 13, which may make it difficult to recognize alignment marks on the surface of the semiconductor element, and may consequently make alignment between the semiconductor element and the substrate difficult.

While content of the inorganic filler is not specifically limited, it is adjusted preferably to 10 to 60 wt % of the entire resin composition, and particularly preferably to 20 to 50 wt %. Too small content of the inorganic filler may degrade the effect of improving the heat resistance, moisture resistance and strength, whereas too large content may degrade the transparency or reduce the tacky property of the resin layer 13.

Alternatively, the resin composition may further contain a silane coupling agent. By containing the silane coupling agent, the resin layer 13 may further be improved in the adhesiveness to the structure to be adhered. The silane coupling agent may be exemplified by an epoxy silane coupling agent, and an aromatic-group-containing amino silane coupling agent. These silane coupling agents may be used in an independent manner, or in a combined form of two or more species of them. While content of the silane coupling agent is not specifically limited, it is preferably adjusted to 0.01 to 5 wt % of the entire resin composition.

The resin composition may also contain component other than those described in the above. For example, various additives may appropriately be added, in view of improving various characteristics of resin including compatibility, stability and workability.

Figure 4:
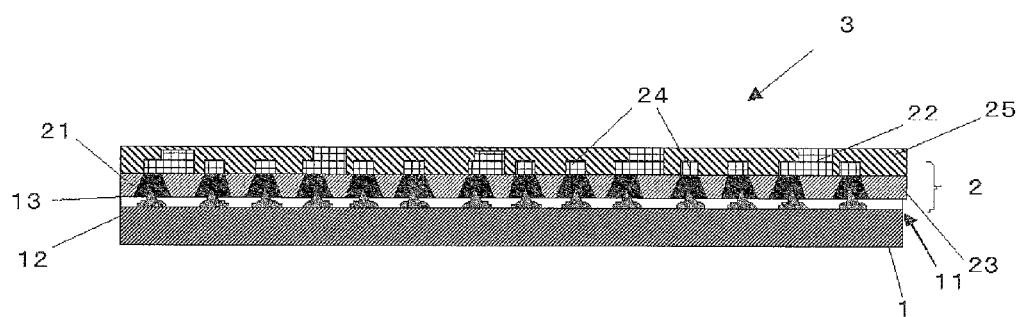
FIG. 4 is a sectional view schematically illustrating an exemplary bonded structure obtained by bonding the semiconductor wafer and the circuit board used in the present invention.

The semiconductor wafer 1 having the resin layer 13 having a flux activity provided thereon, and the circuit board 2 are bonded so as to bring the stud electrodes 12 into contact with the solder bumps 21, while placing the resin layer 13 having a flux activity in between, to thereby obtain the bonded structure 3 (FIG. 4). In this process, the stud electrodes 12 penetrate the resin layer 13, having a flux activity provided between the semiconductor wafer 1 and the circuit board 2, and come into contact with the solder bumps 21. In this way, the stud electrodes 12 and the solder bumps 21 are brought into contact while being covered with the resin layer 13 having a flux activity.

While conditions of bonding are not specifically limited, it may be preferable to align and temporally bond the stud electrodes 12 and the solder bumps 21 by compression bonding at 25 to 175° C., under a load of 0.5 to 5 kgf per unit area, and to thoroughly bond them at 200 to 300° C. for 1 to 60 seconds under a load of 0.1 to 15 kgf per unit area. The compression bonding is more preferably carried out at 200 to 230° C., for 5 to 180 seconds. The temperature of bonding depends on the melting point of solder species of the solder bumps, and the load depends on the number of terminals to be bonded.

Since the stud electrodes 12 and the solder bumps 21 are bonded while placing the resin layer 13 having a flux activity in between, the solder bumps 21 may be bonded while suppressing the surface thereof from being oxidized (while removing the oxide film on the surface).

It may be preferable to further heat the bonded structure 3, to thereby cure the resin composing the resin layer 13 having a flux activity.

While conditions of the heating are not specifically limited, the heating may preferably be carried out at 120 to 200° C. for 30 to 180 minutes, thereby the resin layer 13 having a flux activity may cure, a space between the stud electrodes 12 and the solder bumps 21 may be filled up, and thereby reliability of bonding may be improved.

While the resin layer 13 having a flux activity in this embodiment was cured after the bonded structure 13 was obtained, the process is not limited thereto. The bonded structure 13 may alternatively be obtained after the resin layer 13 having a flux activity was cured.

Next, a solder material is applied to the electrode pads 22 of the bonded structure 3.

Figure 5:
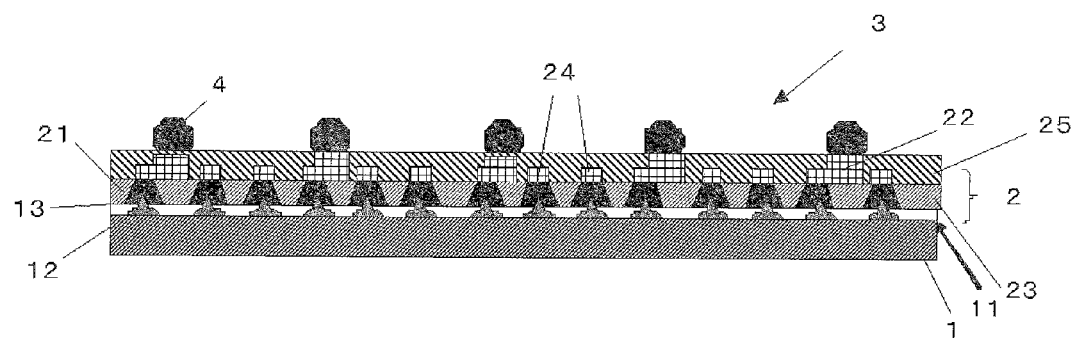
FIG. 5 is a sectional view illustrating an exemplary bonded structure, user in the present invention, applied with a solder material.

As the solder material, solder balls 4 such as those illustrated in FIG. 5 are preferable. By the configuration, secondary mounting onto other substrate or the like may be simplified.

Methods of applying the solder balls 4 may be exemplified by plating, paste printing, and ball mounting.

Next, the bonded structure 3 having the solder balls 4 arranged thereon is diced to obtain a plurality of semiconductor components 31. In the process of dicing of the bonded structure 3, a dicing sheet is attached to the bonded structure 3 on the surface thereof opposite to the surface having the solder balls 4 arranged thereon.

It may be also preferable, before the dicing, to preliminarily place the resin layer having a flux activity on the bonded structure 3 on the surface thereof having the solder balls 4 arranged thereon. In this way, the solder bonding in the secondary mounting may be simplified, treatment with a flux may be omissible, and thereby the productivity, and reliability after the secondary mounting, such as temperature cycle characteristics and drop test, may be improved.

Any dicing sheet commercially available may directly be adoptable to the dicing sheet used herein.

By the above-described processes, a method of manufacturing a semiconductor component, by which the semiconductor wafer before being diced may be bonded with the circuit board, and a plurality of semiconductor components may be produced in an efficient manner by dicing the stacked structure, may be provided. In other words, according to the method of manufacturing, the number of processes as a whole may be reduced.

EXAMPLES

The present invention will be detailed below based on Examples and Comparative Example, without limiting the invention.

Example 1

1. Manufacturing of Semiconductor Wafer Having Stud Electrodes

By gold-wire board bonding process, gold stud bumps were formed using a bump bonder, on Al pads arranged at 70-μm pitches on a semiconductor wafer (6-inch diameter, 250-μm thick). Geometry of each gold stud bump is characterized by a diameter of 30 to 35 μm, pedestal of bump of 15 to 20 μm, a height of bump of 40 to 45 μm, with a steep tip without remained unleveled.

2. Manufacturing of Flexible Circuit Board Having Solder Bumps

A copper-laminated plate, composed of a copper foil of 12 μm thick and a polyimide film (BE2508DFF from Ube-Nitto Kasei Co., Ltd., coefficient of linear expansion=11 ppm/K, thickness=25 μm) as a support base, was subjected to laser machining to have 30-μm-diameter vias formed therein, desmeared, and then plated with a solder (Sn—Ag) so as to form the solder bumps in the vias.

The surface having the bumps arranged thereon was protected, a resist was attached to the copper side, and an interconnect pattern was formed by light exposure, development, etching and stripping of resist. A solder resist was then coated by printing, and sequentially subjected to pre-curing, light exposure, development and post-curing, to thereby allow only lands, which serve as the external connection terminals to expose therefrom. Nickel/gold plating was then applied to the land portions, to thereby manufacture a flexible circuit board having the solder bumps formed thereon. Finally, the flexible circuit board was subjected to profile machining, including formation of the openings, using dies.

3. Preparation of Resin Layer Having Flux Activity

A resin varnish having a solid content of 40% was prepared by dissolving 47.0 wt % of epoxy resin (NC6000, epoxy equivalent weight 200 g/eq, from Nippon Kayaku Co., Ltd.) as the crosslinkable resin; 14.6 wt % of acrylate ester copolymer (butyl acrylate-ethyl acrylate-acrylonitrile-acrylic acid-hydroxyethyl acrylate copolymer SG-708-6, from Nagase ChemteX Corporation, weight-average molecular weight: 500,000) and 14.6 wt % of acryl resin (acrylic acid-styrene copolymer, weight-average molecular weight: 5,500, UC-3900, from TOAGOSEI Co., Ltd.) as the film-forming resins; 0.3 wt % of solid phenol resin (PR-53647, hydroxyl equivalent weight 104 g/OH group, from Sumitomo Bakelite Co., Ltd.) as the curing agent; 0.1 wt % of imidazole compound (2P4MHZ, from Shikoku Chemicals Corporation) as the curing accelerator; 12.9 wt % of phenolphthalein as the flux compound; 0.4 wt % of propyl trimethoxysilane (KBM303, from Shin-Etsu Chemical Co., Ltd.) as the coupling agent; and 0.1 wt % of acryl polymer (BYK-361N, from BYK Japan KK) as a leveling agent, into methyl ethyl ketone.

The obtained varnish was coated on a polyester sheet, and then allowed to dry at a temperature appropriately set so as to vaporize the solvent, to thereby obtain a sheet of a resin layer having a flux activity.

4. Manufacturing of Bonded Structure

The resin layer having a flux activity was bonded to the semiconductor wafer on the functional surface side thereof, using a vacuum film laminator ("MVLP-500/600-2A" from Meiki Co., Ltd.). The bonding of the sheet of the resin layer having a flux activity using the vacuum film laminator was carried out under conditions of 120° C., 0.8 MPa and 30 seconds. Thickness of the resin layer having a flux activity bonded to the semiconductor wafer was found to be 30 µm.

Next, the semiconductor wafer having the stud electrodes thereon and the flexible circuit board having the solder bumps thereon were temporally bonded by thermo-compression bonding, while vertically aligning the solder bumps and the gold stud bumps, using a press machine (VH1-1758). The temporary thermo-compression bonding was carried out at 150° C. under 1.0 MPa. Heating was further continued up to 250° C. while gradually reducing the pressure (0.1 MPa or smaller), and thereby the gold stud bumps on the wafer and the melted solder bumps on the flexible circuit board were alloyed. A bonded structure (wafer with flexible circuit board), which is bonded also in an electrical sense, was obtained by further heating at 180° C. for 120 minutes.

5. Manufacturing of Semiconductor Component

Solder balls were mounted on the thus-obtained semiconductor wafer, a cover film of a commercially-available dicing sheet was peeled off, the dicing sheet was then bonded so as to oppose the adhesive surface thereof with the back surface of the 6-inch wafer having a thickness of 250 µm. The resultant bonded structure was diced (cut) using a dicing saw (from DISCO Corporation) into a chip size, at a number of rotation of spindle of 30,000 rpm and a cutting speed of 50 mm/sec, to obtain a plurality of semiconductor components.

Example 2

Example 2 is same as Example 1, except that a circuit board described below was used.

A support base adopted herein as the flexible circuit board having the solder bumps thereon was made of polyimide (from TOYOBO Co., Ltd.) having a coefficient of linear expansion of 2.5 ppm/K.

Example 3

Example 3 is same as Example 1, except that a product having a plurality of circuit boards 51 bonded to a support 5 as illustrated in FIG. 6 was used as the circuit board. Note that the circuit board used herein has no openings formed therein.

Example 4

Example 4 is same as Example 1, except that a circuit board described below was used.

A copper-laminated board (ELC-4785GS from Sumitomo Bakelite Co., Ltd., coefficient of linear expansion=9 ppm/K), containing a 30-µm-thick glass cloth, and having a thickness of copper foil of 12 µm, was used.

Example 5

Example 5 is same as Example 1, except that a product below was used as the resin layer having a flux activity.

A resin varnish having a solid content of 40% was prepared by dissolving 47.4 wt % of epoxy resin (NC6000, epoxy equivalent weight 200 g/eq, from Nippon Kayaku Co., Ltd.) as the crosslinkable resin; 14.6 wt % of acrylate ester copolymer (butyl acrylate-ethyl acrylate-acrylonitrile-acrylic acid-hydroxyethyl acrylate copolymer SG-708-6 from Nagase ChemteX Corporation, weight-average molecular weight: 500,000), and 14.6 wt % of acryl resin (acrylic acid-styrene copolymer, weight-average molecular weight: 5,500, UC-3900 from TOAGOSEI Co., Ltd.) as the film-forming resins; 16.4 wt % of solid phenol resin (PR-53647, hydroxyl equivalent weight 104 g/OH group, from Sumitomo Bakelite Co., Ltd.) as the curing agent; 0.1 wt % of imidazole compound (2P4MHZ, from Shikoku Chemicals Corporation) as the curing accelerator; 6.4 wt % of sebacic acid as the flux compound; 0.4 wt % of propyl trimethoxysilane (KBM303, from Shin-Etsu Chemical Co., Ltd.) as the coupling agent; and 0.1 wt % of acryl polymer (BYK-361N, from BYK Japan KK) as the leveling agent, into methyl ethyl ketone. The obtained varnish was coated on a polyester sheet, and then allowed to dry at a temperature appropriately set so as to vaporize the solvent, to thereby obtain a sheet of a resin layer having a flux activity.

Comparative Example 1

A flip-chip CSP (chip-size package) was manufactured in this Comparative Example.

A photo-sensitive polyimide (CRC-8300 from from Sumitomo Bakelite Co., Ltd.) was coated on the semiconductor wafer (size: 6 inches, thickness: 350 µm) using a spin coater, and was then subjected to light exposure, development and curing to thereby allow the Al pads to expose. In the openings, nickel was applied by electroless plating, gold was applied again by electroless plating, and the solder balls were mounted thereon. The product was diced into chips.

Next, the above-described chip having the solder balls mounted thereon was bonded to a rigid substrate (from Arm Electronics Co., Ltd.) having terminals at the same positions with those of the solder balls, using a flip-chip bonder. Note that the terminals on the top surface of the rigid substrate were preliminarily coated with a pre-solder by printing, and the oxide films on the upper and lower solder surfaces were preliminarily removed using a flux before the bonding.

After the bonding, the flux was cleaned off, a capillary underfill resin (CRP-4152D from Sumitomo Bakelite Co., Ltd.) was injected into a gap in the bonding portion, and the resin was cured. The rigid substrate has terminals for area mounting through which mounting on the board is enabled, preliminarily formed on the back surface thereof, wherein the terminals on the top surface side and the back surface side are connected with a copper circuit. A flip-chip-type CSP was obtained by mounting the solder balls onto the terminals for area mounting.

Comparative Example 2

As a Comparative Example, a re-distribution-type wafer level CSP was manufactured.

A photo-sensitive polyimide (CRC-8300 from Sumitomo Bakelite Co., Ltd.) was coated on the semiconductor wafer (size: 6 inches, thickness: 350 µm) using a spin coater, and was then subjected to light exposure, development and curing to thereby allow the Al pads to expose. A titanium film of 500-angstrom thick was formed by sputtering, a copper film of 3,000-angstrom thick was stacked thereon by sputtering, a resist was coated, a circuit pattern for re-distributing the terminals on the chip towards the external connection terminals for area mounting on the board was formed in the resist by light exposure and development, and copper was plated only on a portion of the circuit pattern. The resist was then removed, and the copper film and the titanium film were etched to form a copper circuit pattern. Again a photo-sensitive polyimide (CRC-3900 from Sumitomo Bakelite Co., Ltd.) was coated thereon as an insulating film, subjected to light exposure, development and curing according a pattern, to thereby expose the lands as the external connection terminals, the land are then plated with nickel, and successively with gold, and the solder balls were mounted thereon. The product was diced into a chip size, to obtain the semiconductor components.

The semiconductor components obtained in Examples and Comparative Examples were evaluated as follows. Items of evaluation will be shown together with the details. Results are shown in Table 1.

1. Productivity

Assuming the number of processes in Comparative Example 1 as (100), productivity of other Examples and Comparative Examples were comparatively examined. Meaning of the individual symbols are given below:

A: the number of processes was 40 or larger and less than 60, assuming the number of processes in Comparative Example 1 as (100);

B: the number of processes was 60 or larger and less than 80, assuming the number of processes in Comparative Example 1 as (100);

C: the number of processes was 80 or larger and less than 100, assuming the number of processes in Comparative Example 1 as (100); and D: the number of processes was 100 or larger, assuming the number of processes in Comparative Example 1 as (100).

2. Reliability of Bonding

Reliability of bonding of the semiconductor components was evaluated based on whether electrical contact may be confirmed after a temperature cycle test.

More specifically, the connection resistance between the semiconductor element and the board was measured using a digital multimeter. The measurement was made on the semiconductor components as manufactured, and also after 1,000 temperature cycles at −65° C. for one hour and at 150° C. at one hour. Meaning of the individual symbols are given below:

A: electrical contact confirmed in 20 out of 20 semiconductor components;

B: electrical contact confirmed in 19 out of 20 semiconductor components;

C: electrical contact confirmed in 16 to 17 out of 20 semiconductor components; and D: electrical contact confirmed in 16 or fewer out of 20 semiconductor components.

3. Reflow Crack Resistance

Reflow crack resistance was evaluated by treating the obtained semiconductor components to absorb moisture in a thermostat/hygrostat chamber conditioned at 85° C. and a relative humidity of 85% for 168 hours, immediately subjecting them to reflow process using a reflow apparatus (260° C. at maximum, for 10 seconds), and presence or absence of internal separation was confirmed using a ultrasonic flaw detector (SAT). The treatment followed the JEDEC Standards. Meaning of the individual symbols are given below. Number of samples was 20.

A: No internal separation detected after treatment; and

D: internal separation detected after treatment.

TABLE 1

|  | Example 1 | Example 2 | Example 3 | Example 4 | Example 5 | Comparative Example 1 | Comparative Example 2 |
|---|---|---|---|---|---|---|---|
| Productivity | 40A | 40A | 40A | 40A | 40A | 100 | 80C |
| Reliability of bonding | 20B | 20B | 19B | 20B | 20B | 20B | 20B |
| Reflow crack resistance | A | A | A | A | A | D | D |

As clearly known from Table 1, Examples 1 to 5 were found to be excellent in the productivity.

The semiconductor components obtained in Examples 1 to 5 were also found to be excellent in the reliability of bonding and reflow crack resistance.

The invention claimed is:

1. A method of manufacturing a semiconductor component comprising:
    obtaining a semiconductor wafer having stud electrodes formed on a functional surface thereof, and a circuit board having solder bumps on one surface and having electrode pads on the other surface thereof;
    bonding said semiconductor wafer and said circuit board, while providing a resin layer having a flux activity between said semiconductor wafer and said circuit board, and so as to bring said stud electrodes into contact with said solder bumps, to thereby obtain a bonded structure;
    applying a solder material onto said electrode pads of said bonded structure; and
    dicing said bonded structure to obtain a plurality of semiconductor components.

2. The method of manufacturing a semiconductor component as claimed in claim 1,
    wherein said circuit board has openings formed therein, so as to allow therethrough effluence of said resin layer having a flux activity in the step of bonding of said semiconductor wafer with said circuit board.

3. The method of manufacturing a semiconductor component as claimed in claim 2,
    wherein said opening extends through the circuit board from one surface to the other surface.

4. The method of manufacturing a semiconductor component as claimed in claim 2,
    wherein said opening is formed on the dicing line for dicing said bonded structure.

5. The method of manufacturing a semiconductor component as claimed in claim 1,
    wherein said resin layer having a flux activity is a film, and in said step of bonding, said semiconductor wafer and said circuit board are bonded, while keeping said film bonded to said functional surface of said semiconductor wafer.

6. The method of manufacturing a semiconductor component as claimed in claim 1, wherein said resin layer having a flux activity is a film; and said step of bonding comprises, bonding said film to the surface of said circuit board having said solder bumps formed thereon, and bonding said semiconductor wafer and said circuit board.

7. The method of manufacturing a semiconductor component as claimed in claim 1, wherein said circuit board is a flexible circuit board.

8. The method of manufacturing a semiconductor component as claimed in claim 7, wherein said flexible circuit board has a coefficient of thermal expansion in the in-plane direction of 10 [ppm/K] or smaller.

9. The method of manufacturing a semiconductor component as claimed in claim 7, wherein said flexible circuit board has a coefficient of thermal expansion in the in-plane direction of 4 [ppm/K] or larger.

10. The method of manufacturing a semiconductor component as claimed in claim 1, wherein said circuit board is a rigid circuit board.

11. The method of manufacturing a semiconductor component as claimed in claim 10, wherein said rigid circuit board has a coefficient of thermal expansion in the in-plane direction of 15 [ppm/K] or smaller.

12. The method of manufacturing a semiconductor component as claimed in claim 10, wherein said rigid circuit board has a coefficient of thermal expansion in the in-plane direction of 5 [ppm/K] or larger.

13. The method of manufacturing a semiconductor component as claimed in claim 1, wherein said circuit board is configured by a plurality of circuit boards bonded to a support, and said plurality of circuit boards are arrnaged in plane of said support.

14. The method of manufacturing a semiconductor component as claimed in claim 1, wherein said resin layer having a flux activity is configured by a resin composition which contains a crosslinkable resin and a compound having a flux activity.

15. The method of manufacturing a semiconductor component as claimed in claim 14, wherein said compound having a flux activity serves as a curing agent of said crosslinkable resin.

16. The method of manufacturing a semiconductor component as claimed in claim 14, wherein said compound having a flux activity has at least one carboxyl group or phenolic hydroxyl group in the molecule.

17. The method of manufacturing a semiconductor component as claimed in claim 14, wherein said compound having a flux activity is represented by the formula (1) below:

[Chemical Formula 1]

$$HOOC-(CH_2)_n-COOH \qquad (1)$$

(n is an integer which satisfies $0 \leq n \leq 20$).

18. The method of manufacturing a semiconductor component as claimed in claim 1, wherein said electrode pads applied with said solder material are further applied with a resin layer having a flux activity.

19. A semiconductor component obtained by the method of manufacturing a semiconductor component described in claim 1.

20. The method of manufacturing a semiconductor component as claimed in claim 1, wherein in said step of bonding, said stud electrodes is brought into contact with said solder bumps, while penetrating said resin layer having a flux activity.

* * * * *